United States Patent
Sagara et al.

(10) Patent No.: US 9,528,026 B2
(45) Date of Patent: Dec. 27, 2016

(54) RESIN COMPOSITION, RESIN VARNISH, PREPREG, METAL-CLAD LAMINATE, AND PRINTED WIRING BOARD

(75) Inventors: Takashi Sagara, Fukushima (JP); Hidetaka Kakiuchi, Fukushima (JP); Keiko Kashihara, Osaka (JP); Yuki Kitai, Osaka (JP); Hirosuke Saito, Osaka (JP); Daisuke Yokoyama, Hyogo (JP); Hiroaki Fujiwara, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 10 days.

(21) Appl. No.: 14/232,862

(22) PCT Filed: Jul. 13, 2012

(86) PCT No.: PCT/JP2012/004539
§ 371 (c)(1),
(2), (4) Date: Jan. 14, 2014

(87) PCT Pub. No.: WO2013/011677
PCT Pub. Date: Jan. 24, 2013

(65) Prior Publication Data
US 2014/0182903 A1 Jul. 3, 2014

(30) Foreign Application Priority Data

Jul. 19, 2011 (JP) ................................. 2011-157837
Jul. 19, 2011 (JP) ................................. 2011-157838

(51) Int. Cl.
| | |
|---|---|
| C09D 171/00 | (2006.01) |
| B32B 15/08 | (2006.01) |
| C08J 5/24 | (2006.01) |
| C08L 71/12 | (2006.01) |
| C08G 59/38 | (2006.01) |
| C08L 71/00 | (2006.01) |
| C08G 59/32 | (2006.01) |
| C08G 59/42 | (2006.01) |
| C08G 59/50 | (2006.01) |
| C08K 5/18 | (2006.01) |
| C08K 5/3445 | (2006.01) |
| C08K 5/5399 | (2006.01) |
| H05K 1/03 | (2006.01) |

(52) U.S. Cl.
CPC ............ *C09D 171/00* (2013.01); *B32B 15/08* (2013.01); *C08G 59/3218* (2013.01); *C08G 59/38* (2013.01); *C08G 59/42* (2013.01); *C08G 59/5073* (2013.01); *C08J 5/24* (2013.01); *C08L 71/00* (2013.01); *C08L 71/12* (2013.01); *H05K 1/0353* (2013.01); *B32B 2457/08* (2013.01); *C08J 2371/12* (2013.01); *C08J 2463/00* (2013.01); *C08K 5/18* (2013.01); *C08K 5/3445* (2013.01); *C08K 5/5399* (2013.01); *H05K 1/0326* (2013.01); *H05K 1/0366* (2013.01); *Y10T 428/31529* (2015.04)

(58) Field of Classification Search
CPC ... C09D 171/00; C08G 59/5073; C08G 59/38; C08G 59/3218; C08G 59/42; C08L 71/00; C08L 71/12; C08J 5/24; C08J 2371/12; C08J 2463/00; B32B 15/08; B32B 457/08; Y10T 428/31529; H05K 1/0326; H05K 1/0366; H05K 1/0353; C08K 5/3445; C08K 5/5399; C08K 5/18
USPC ................................................. 525/396, 524
See application file for complete search history.

(56) References Cited

U.S. PATENT DOCUMENTS

| | | | |
|---|---|---|---|
| 6,352,782 B2 | 3/2002 | Yeager et al. | |
| 2003/0009001 A1* | 1/2003 | Akatsuka et al. | 528/86 |
| 2005/0228087 A1 | 10/2005 | Murakami et al. | |
| 2007/0004872 A1 | 1/2007 | Lu et al. | |
| 2007/0093614 A1* | 4/2007 | Uchida et al. | 525/396 |
| 2009/0012233 A1 | 1/2009 | Hamada et al. | |
| 2009/0023351 A1 | 1/2009 | Kashihara et al. | |
| 2009/0032286 A1 | 2/2009 | Urakawa et al. | |
| 2009/0247724 A1* | 10/2009 | Carrillo et al. | 528/171 |
| 2009/0308642 A1 | 12/2009 | Murata et al. | |
| 2010/0062211 A1* | 3/2010 | Kawazoe et al. | 428/116 |
| 2010/0148379 A1 | 6/2010 | Noro et al. | |
| 2011/0007489 A1* | 1/2011 | Ohigashi et al. | 361/783 |

FOREIGN PATENT DOCUMENTS

| | | |
|---|---|---|
| CN | 101370870 A | 2/2009 |
| CN | 101583647 A | 11/2009 |

(Continued)

OTHER PUBLICATIONS

Byk; Paint Additives, Feb. 2009, p. 1-16.*

(Continued)

*Primary Examiner* — Robert Jones, Jr.
(74) *Attorney, Agent, or Firm* — McDermott Will & Emery LLP

(57) ABSTRACT

An object is to provide a resin composition that has excellent dielectric properties, that yields a highly heat-resistant cured product, that provides a low viscosity when made into a varnish, and that has a high Tg and a high flame retardancy without containing halogen. The resin composition contains a polyarylene ether copolymer (A) that has an intrinsic viscosity, measured in methylene chloride at 25° C., of 0.03 to 0.12 dL/g and that has an average of 1.5 to 3 phenolic hydroxyl groups in molecular terminal position per molecule, a triphenylmethane-type epoxy resin (B) that has a softening point of 50 to 70° C., and a cure accelerator (C), wherein the content of the polyarylene ether copolymer (A) is 60 to 85 mass parts where the total of the polyarylene ether copolymer (A) and the epoxy resin (B) is 100 mass parts.

21 Claims, No Drawings

(56) References Cited

FOREIGN PATENT DOCUMENTS

| JP | 06-329757 A | 11/1994 |
|---|---|---|
| JP | 2001-181479 A | 7/2001 |
| JP | 3886053 B2 | 2/2007 |
| JP | 2007-326929 A | 12/2007 |
| JP | 2008-050526 A | 3/2008 |
| JP | 2008-545045 A | 12/2008 |
| JP | 2011-046816 A | 3/2011 |
| WO | 2006-109744 A1 | 10/2006 |
| WO | 2007-096945 A1 | 8/2007 |
| WO | 2008-033611 A1 | 3/2008 |
| WO | 2008-143085 A1 | 11/2008 |

OTHER PUBLICATIONS

International Search Report issued in PCT/JP2012/004539, dated Aug. 28, 2012, with English translation, 4 pages.
Chinese Office Action issued in Chinese Application No. 201280035322.9, dated Mar. 24, 2015, with English translation of the Search Report.
Japanese Office Action dated Nov. 18, 2014 issued in corresponding Japanese Patent Application No. 2013-524606.

* cited by examiner

RESIN COMPOSITION, RESIN VARNISH, PREPREG, METAL-CLAD LAMINATE, AND PRINTED WIRING BOARD

RELATED APPLICATIONS

This application is the U.S. National Phase under 35 U.S.C. §371 of International Application No. PCT/JP2012/004539, filed on Jul. 13, 2012, which in turn claims the benefit of Japanese Application No. 2011-157837, filed on Jul. 19, 2011 and Japanese Application No. 2011-157838, filed on Jul. 19, 2011, the disclosures of which Applications are incorporated by reference herein.

TECHNICAL FIELD

The present invention relates to a resin composition that is favorably used as, for example, an insulating material in a printed wiring board, and to a resin varnish that contains this resin composition, a prepreg obtained using this resin varnish, a metal-clad laminate obtained using this prepreg, and a printed wiring board fabricated using this prepreg.

BACKGROUND ART

The amount of information processed by various types of electronic devices has been increasing in recent years, and this has been accompanied by rapid advances in packaging technology, e.g., greater integration for the mounted semiconductor devices, higher interconnect densities, and multilayering. The insulating materials in, for example, the printed wiring boards used in various electronic devices, must have a low dielectric constant and a low dissipation factor in order to increase the signal transmission velocity and lower the losses during signal transmission and must have a high glass-transition temperature (Tg) to support the more extensive multilayering brought about by the addition of wiring.

Polyphenylene ether (PPE) has excellent dielectric properties, e.g., dielectric constant and dissipation factor, even in the high-frequency band (high-frequency region) from the MHz band to the GHz band, and because of this it is advantageously used for the insulating materials in, for example, printed wiring boards, in electronic devices that use the high-frequency band. However, high molecular weight PPE generally has a high melting point and as a consequence tends to have a high viscosity and a low fluidity. Moldability problems have appeared—i.e., molding defects, for example, the appearance of voids during multilayer molding, have been produced during fabrication and the preparation of highly reliable printed wiring boards has been problematic—when such a PPE has been used to form a prepreg for the fabrication of, e.g., a multilayer printed wiring board, and a printed wiring board has then been fabricated using the thusly formed prepreg. In order to solve such problems, for example, an art is known in which molecular scission is induced and the molecular weight of the PPE is reduced by carrying out a redistribution reaction on the high molecular weight PPE in a solvent in the presence of a phenol and a radical initiator. However, there have been problems with reducing the molecular weight of PPE in that the cure becomes inadequate and, inter alia, the heat resistance of the cured product is reduced.

The resin compositions described in the Patent Documents 1 to 4 given below are examples of resin compositions that contain a resin in which the main component is an aromatic polyether structure such as, for example, PPE.

The curable polyphenylene ether composition described in Patent Document 1 contains a curable unsaturated monomer and a polyphenylene ether that contains a hydroxyl group that has been capped by a compound containing ethylenic unsaturation.

The flame-retardant composition described in Patent Document 2 comprises a polyphenylene ether and a phosphazene compound.

The curable composition disclosed in Patent Document 3 comprises an epoxy resin, a bifunctional polyarylene ether, and a curing catalyst in an amount effective for curing the epoxy resin, and yields a cured product with a prescribed impact strength value.

The resin compound disclosed in Patent Document 4 comprises a polyarylene ether copolymer having prescribed properties, an epoxy resin, a cure accelerator, and a phosphorus-containing compound having prescribed properties.

Patent Document 1: U.S. Pat. No. 6,352,782
Patent Document 2: Japanese Patent No. 3886053
Patent Document 3: WO 2008/033611
Patent Document 4: Japanese Patent Application Laid-open No. 2011-46816

However, the resin described in Patent Document 1 in which the main component is an aromatic polyether structure is a monofunctional PPE having an intrinsic viscosity of 0.15 dL/g. When a resin composition provided by combining such a PPE with an epoxy resin was made into a resin varnish, a high viscosity was produced and a trend of a rising viscosity with elapsed time (i.e., a declining fluidity) also appeared. In particular, this trend became quite pronounced when the PPE proportion was raised. Moldability problems appeared—i.e., molding defects, for example, the appearance of voids during multilayer molding, were produced during fabrication and the preparation of a highly reliable printed wiring board was problematic—when such a resin composition was used to form a prepreg and a printed wiring board was then fabricated using the thusly formed prepreg. Moreover, the composition described in Patent Document 1 used a brominated flame retardant as its flame retardant and was thus not an environmentally friendly halogen-free material.

A problem with the resin composition described in Patent Document 2 was that it lacked the solder heat resistance required for application with electronic components. Specifically, the blending of a monofunctional PPE with a difunctional epoxy resin is described in the examples. However, this resin composition, although it could secure flame retardancy while being halogen-free, had a low Tg and an inadequate solder heat resistance. It is hypothesized from this that the flame retardancy was raised due to the incorporation of the phosphazene compound, but that this phosphazene compound acted as a plasticizer and three-dimensional crosslinking was required. In addition, the PPE with its excellent dielectric properties was incorporated at not more than 50 mass % and thus the dielectric properties were also inadequate.

In addition, Patent Document 3 states that a flame retardant may be incorporated in the resin composition comprising a polyarylene ether and an epoxy resin. However, when a flame retardant was incorporated, a trend of a declining heat resistance by the cured product was present and in some cases the heat resistance of the cured product and the dielectric properties were not adequate.

In comparison to the resin compositions in Patent Documents 1 to 3, the resin composition described in Patent Document 4 is considered to be a resin composition that has a better heat resistance by the cured product, better dielectric properties, and a higher flame retardancy and that provides a lower viscosity (i.e., has better handling characteristics) when made into a varnish. However, even higher glass-transition temperatures (Tg) have come to be required in recent years due to the more extensive multilayering brought about by the addition of wiring, and thus at the present time a resin composition is required that has, in addition to the previously described properties, a higher glass-transition temperature (Tg).

SUMMARY OF THE INVENTION

The present invention was pursued in view of these circumstances and takes as an object the introduction of a halogen-free resin composition that has a high Tg in addition to having an excellent heat resistance for the cured product, excellent dielectric properties, a low viscosity when made into a varnish, and a high flame retardancy. Additional objects are to provide a resin varnish that contains this resin composition, a prepreg that is obtained using this resin varnish, a metal-clad laminate that is obtained using this prepreg, and a printed wiring board that uses this metal-clad laminate.

As a result of focused investigations in order to solve the problems described above, the present inventors discovered that these problems could be solved by the following means.

That is, the resin composition according to an aspect of the present invention comprises a polyarylene ether copolymer (A) that has an intrinsic viscosity, measured in methylene chloride at 25° C., of 0.03 to 0.12 dL/g and that has an average of 1.5 to 3 phenolic hydroxyl groups in molecular terminal position per molecule, a triphenylmethane-type epoxy resin (B) that has a softening point of 50 to 70° C., and a cure accelerator (C), wherein the content of the polyarylene ether copolymer (A) is 60 to 85 mass parts where the total of the polyarylene ether copolymer (A) and the epoxy resin (B) is 100 mass parts.

The present invention can provide a resin composition that yields a highly heat-resistant cured product, that has excellent dielectric properties, that provides a low viscosity when made into a varnish, and that has a high Tg and a high flame retardancy without containing halogen. The present invention also provides a resin varnish that contains this resin composition, a prepreg obtained using this resin varnish, a metal-clad laminate obtained using this prepreg, and a printed wiring board produced using this prepreg.

DESCRIPTION OF EMBODIMENTS

The resin composition according to an embodiment of the present invention comprises (A) a polyarylene ether copolymer that has an intrinsic viscosity, measured in methylene chloride at 25° C., of 0.03 to 0.12 dL/g and that has an average of 1.5 to 3 phenolic hydroxyl groups in molecular terminal position per molecule, (B) a triphenylmethane-type epoxy resin that has a softening point of 50 to 70° C., and (C) a cure accelerator, wherein the content of the polyarylene ether copolymer (A) is 60 to 85 mass parts where the total of the polyarylene ether copolymer (A) and the epoxy resin (B) is 100 mass parts.

This construction provides a halogen-free resin composition that yields a highly heat-resistant cured product, that has excellent dielectric properties, that provides a low viscosity when made into a varnish, and that has a high flame retardancy and also a high Tg. Thus, it is thought that the excellent dielectric properties exhibited by the polyarylene ether copolymer (A) can be retained through the incorporation of relatively large amounts of the polyarylene ether copolymer (A), and that, through the addition of the triphenylmethane-type epoxy resin (B) having a softening point of 50 to 70° C., a high Tg can be achieved while retaining these properties without impairment.

The polyarylene ether copolymer (A) should be a polyarylene ether copolymer that has an intrinsic viscosity, measured in methylene chloride at 25° C., of 0.03 to 0.12 dL/g and that has an average of 1.5 to 3 phenolic hydroxyl groups in molecular terminal position per molecule, but is not otherwise particularly limited.

It is sufficient for the intrinsic viscosity under consideration to be 0.03 to 0.12 dL/g, but this intrinsic viscosity is more preferably 0.06 to 0.095 dL/g. When this intrinsic viscosity is too low, the molecular weight tends to be low and obtaining a satisfactory heat resistance for the cured product tends to be problematic. When this intrinsic viscosity is too high, a satisfactory fluidity is then not obtained due to the high viscosity and there tends to be no ability to prevent molding defects.

The intrinsic viscosity may be acquired from the specifications for the polyarylene ether copolymer (A) product that is used. This intrinsic viscosity is also the intrinsic viscosity measured in methylene chloride at 25° C. and more specifically is, for example, the value measured with a viscometer on a 0.18 g/45 mL methylene chloride solution (solution temperature=25° C.). The viscometer can be exemplified by the ViscoSystem AVS 500 from Schott Instruments.

It is sufficient for the polyarylene ether copolymer (A) to have an average number of phenolic hydroxyl groups in molecular terminal position (number of terminal hydroxyl groups) per molecule of 1.5 to 3, but 1.8 to 2.4 is preferred. When the number of terminal hydroxyl groups is too small, the reactivity with the epoxy groups in the epoxy resin (B) is reduced and it will then tend to be difficult to obtain a satisfactory heat resistance for the cured product. When the number of terminal hydroxyl groups is too large, the reactivity with the epoxy groups in the epoxy resin (B) is then too high and, for example, the storability of the resin composition may decline and problems may occur such as an increase in the dielectric constant and an increase in the dissipation factor.

The number of hydroxyl groups in the polyarylene ether copolymer (A) is acquired from the specifications for the low molecular weight polyphenylene ether product that is used. The number of terminal hydroxyl groups is specifically, for example, the numerical value that represents the average value of the hydroxyl groups per molecule for all the polyarylene ether copolymer (A) that is present in 1 mol of the polyarylene ether copolymer (A).

The number-average molecular weight (Mn) of the polyarylene ether copolymer (A) is preferably 500 to 3,000 and is more preferably 650 to 1,500. A satisfactory heat resistance is obtained for the cured product when this molecular weight is at least 500, while the melt viscosity is not too high and a satisfactory fluidity can be obtained when the molecular weight is not more than 3,000.

The number-average molecular weight of the polyarylene ether copolymer (A) can be measured in the present invention specifically, for example, using gel permeation chromatography.

The polyarylene ether copolymer (A) can be specifically exemplified by polyarylene ether copolymers consisting of 2,6-dimethylphenol and a difunctional phenol and by polyarylene ether copolymers in which the main component is a polyphenylene ether such as poly(2,6-dimethyl-1,4-phenylene oxide). The difunctional phenol can be exemplified by tetramethylbisphenol A and so forth. The polyarylene ether copolymer (A) can be more specifically exemplified by polyarylene ether copolymers having the structure given by the following general formula (1).

[C1]

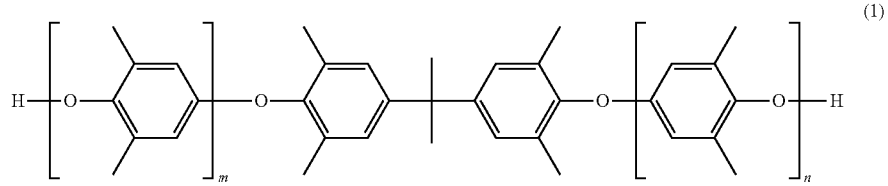

The m and n in formula (1) should be degrees of polymerization that bring the intrinsic viscosity into the previously described range. Specifically, the sum of m and n is preferably 1 to 30. In addition, m is preferably 0 to 20 and n is preferably 0 to 20. The use of a polyarylene ether copolymer with this structure reliably provides a resin composition having an even better heat resistance for the cured product and even better dielectric properties.

The polyarylene ether copolymer can be produced, for example, using the method described in WO 2007/067669. Commercially available products may also be used for this polyarylene ether copolymer; for example, "SA-90" from SABIC Innovative Plastics can be used.

The content of the polyarylene ether copolymer (A) is 60 to 85 mass parts for each 100 mass parts of the total amount of the polyarylene ether copolymer (A) and the epoxy resin (B), infra. When this polyarylene ether copolymer (A) is present at such a relatively high content, although it is a thermosetting resin, the cured product can be toughened and a large elongation and flexure can be provided. A more preferred content for the polyarylene ether copolymer (A) is 60 to 70 mass parts for each 100 mass parts of the total amount of the polyarylene ether copolymer (A) and the epoxy resin (B), infra.

The excellent dielectric properties possessed by the polyarylene ether copolymer (A) can be retained when the polyarylene ether copolymer (A) is at least 60 mass parts. In addition, the cured product exhibits an excellent heat resistance when the polyarylene ether copolymer (A) is not more than 85 mass parts. That is, it is thought that, by having the content of the polyarylene ether copolymer (A) be in the indicated range, a resin composition is then obtained that yields an even more highly heat-resistant cured product, that has even better dielectric properties, that provides a low viscosity when made into a varnish, that can exhibit the excellent dielectric properties of the polyarylene ether copolymer (A), and that has a high flame retardancy while not containing halogen.

Any triphenylmethane-type epoxy resin that has a softening point of 50 to 70° C. can be used without particular limitation as the epoxy resin (B). It is thought that, by using such an epoxy resin, a resin composition can then be obtained that has a high Tg while retaining properties such as the dielectric properties, heat resistance of the cured product, and flame retardancy intact.

A high Tg can be achieved when the softening point of the epoxy resin is at least 50° C., while not more than 70° C. is preferred from the standpoint of improving the external appearance of the prepreg, infra. The softening point of the epoxy resin is more preferably 53 to 65° C. and is even more preferably 55 to 60° C.

The softening point of the epoxy resin can be measured using the known methodologies that are commonly carried out in the technical field to which the present invention belongs. Specifically, for example, the measurement can be performed based on JIS K 7234, "Testing methods for softening point of epoxide resins".

As a specific example, a triphenylmethane-type epoxy resin as represented by the following chemical formula (2) and having a softening point of 50 to 70° C. can be used.

[C2]

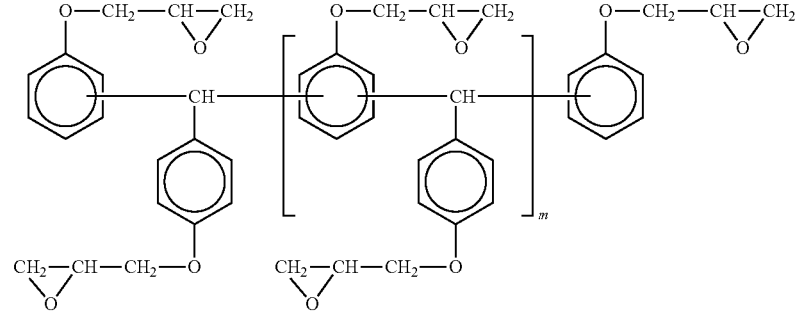

(m in formula (2) represents an integer from 1 to 10)

For example, commercial products can also be used for this triphenylmethane-type epoxy resin having a softening point of 50 to 70° C., and specific examples in this regard are "EPPN501H" (softening point=53° C.), "EPPN501HY" (softening point=59° C.), and "EPPN502H" (softening point=65° C.), all from Nippon Kayaku Co., Ltd.

Any cure accelerator that can accelerate the curing reaction between the polyarylene ether copolymer (A) and the epoxy resin (B) can be used without particular limitation for the cure accelerator (C). Specific examples here are imidazole compounds such as 2-methylimidazole, 2-ethyl-4-methylimidazole, 2-phenyl-4-methylimidazole, 2-phenylimidazole, 1-benzyl-2-methylimidazole, and so forth; organophosphine compounds such as triphenylphosphine, tributylphosphine, trimethylphosphine, and so forth; tertiary amine compounds such as 1,8-diazabicyclo(5.4.0)undec-7-ene (DBU), triethanolamine, benzyldimethylamine, and so forth; and metal salts of fatty acids. The metal salts of fatty acids are generally known as metal soaps and can be specifically exemplified by fatty acid metal salts produced from a fatty acid such as stearic acid, lauric acid, ricinoleic acid, octylic acid, and so forth, and a metal such lithium, magnesium, calcium, barium, zinc, and so forth. Zinc octylate is a more specific example. A single one of these cure accelerators (C) may be used or a combination of two or more may be used.

Among the preceding, the incorporation of at least one selected from the imidazole compounds and metal salts of fatty acids as the cure accelerator (C) is preferred from the standpoint of obtaining a resin composition that has even better dielectric properties and an even better heat resistance for the cured product, and the incorporation of an imidazole compound and the metal salt of a fatty acid is more preferred. A resin composition having even better dielectric properties and an even better heat resistance (solder heat resistance) for the cured product is obtained through the three dimensional crosslinking brought about by the use of such a cure accelerator.

As to the content of the cure accelerator (C), when, for example, an imidazole compound is used as the cure accelerator (C), the content of the cure accelerator (C) is preferably approximately 0.05 to 1 mass parts, where the total amount of the polyarylene ether copolymer (A) and epoxy resin (B) is 100 mass parts. When a fatty acid metal salt is used in combination with the imidazole compound, the content of the fatty acid metal salt is preferably approximately 0.5 to 3 mass parts for each 100 mass parts of the total amount of the polyarylene ether copolymer (A) and epoxy resin (B). When the content of the cure accelerator (C) is too low, the ability to increase the cure-accelerating effect then tends to be absent. When it is too large, problems with the moldability tend to be produced; also, a too large content for the cure accelerator tends to be economically disadvantageous. The life of the resin composition also presents a declining trend.

The hereinabove described construction can provide a resin composition that yields a highly heat-resistant cured product, that has excellent dielectric properties, that provides a low viscosity when made into a varnish, and that has a high Tg and a high flame retardancy without containing halogen. In addition, it can provide a resin varnish that contains this resin composition, a prepreg obtained using this resin varnish, a metal-clad laminate obtained using this prepreg, and a printed wiring board produced using this prepreg.

During the production of, for example, a printed wiring board, typically an insulating material (resin composition) is used generally after conversion into a varnish and then into a prepreg configuration. The thickness of the prepreg is adjusted as appropriate as a function of its application, but when a thick prepreg is fabricated, evaporation of the solvent during drying is problematic and abnormalities in the external appearance due to foaming may occur. However, when a high softening point material that had been oligomerized in order to raise the Tg was selected, it was extremely difficult to also improve the external appearance of a thick and high Tg prepreg.

Therefore, in addition to the components already described in the preceding, the resin composition according to an embodiment of the present invention preferably also incorporates an at least difunctional epoxy resin (D) that is a liquid at 30° C., wherein the content of the polyarylene ether copolymer (A) is 60 to 85 mass parts where the total of the polyarylene ether copolymer (A), the triphenylmethane-type epoxy resin (B), and the at least difunctional epoxy resin (D) is 100 mass parts.

This construction makes it possible to obtain a superior external appearance also upon conversion into the prepreg, infra. The presence of abnormalities in the external appearance of the prepreg is unfavorable because they can cause the appearance of voids in the molded product and can cause the generation of abnormalities in the external appearance, e.g., nicks due to the detachment of prepreg dust during the molding process, and as a consequence a resin composition with such a construction is also extremely useful in terms of industrial practice.

Any at least difunctional epoxy resin that is a liquid at 30° C. can be used without particular limitation as the epoxy resin (D). It is thought that, by using this epoxy resin (D), a resin composition can be obtained that has a high Tg and that provides an excellent external appearance when converted into the prepreg, while properties such as the dielectric properties, heat resistance for the cured product, flame retardancy, and so forth, are retained intact.

Specific examples here are bisphenol-type epoxy resins such as bisphenol A-type epoxy resins, and bisphenol F-type epoxy resins, as well as biphenyl-type epoxy resins, naphthalene-type epoxy resins, alicyclic epoxy resins, and amine-type epoxy resins. Those obtained by synthesis as well as those obtained commercially can be used without particular limitation.

When the resin composition according to the present embodiment contains this epoxy resin (D), it is preferably incorporated so as to provide an epoxy resin (D) content of 7 to 23 mass parts where the total of the polyarylene ether copolymer (A), the triphenylmethane-type epoxy resin (B), and the at least difunctional epoxy resin (D) is 100 mass parts. It is thought that the use of this range makes it possible to obtain a resin composition with a low dielectric constant and a high Tg that also provides an excellent external appearance when converted into the prepreg (particularly a thick article).

With regard to the content of the cure accelerator (C) when the resin composition of the present embodiment contains the epoxy resin (D), and for the case in which an imidazole compound is incorporated as the cure accelerator (C), the imidazole compound content is then preferably approximately 0.05 to 1 mass parts for each 100 mass parts of the total amount of the polyarylene ether copolymer (A), triphenylmethane-type epoxy resin (B), and at least difunctional epoxy resin (D). In addition, when a fatty acid metal salt is used in combination with the imidazole compound, the content of this fatty acid metal salt is preferably approximately 0.5 to 3 mass parts for each 100 mass parts of the total amount of the polyarylene ether copolymer (A), triphenylmethane-type epoxy resin (B), and at least difunctional epoxy resin (D). When the content of the cure accelerator (C) is too low, the ability to increase the cure-accelerating effect then tends to be absent. When it is too large, problems with the moldability tend to be produced; also, a too large content for the cure accelerator tends to be economically disadvantageous. The life of the resin composition also presents a declining trend.

Viewed from the standpoint of compatibility, the resin composition according to the present embodiment may also contain a phosphorus-containing compound (E). There are no particular limitations on the phosphorus-containing compounds (E) that can be incorporated, but cyclic phosphazene compounds are preferred specific examples. It is thought that lowering of the Tg of the resin composition can be suppressed and the reliability can also be improved by incorporating this phosphorus-containing compound (E). Cyclic phosphazene compounds are also known as cyclophosphazenes and are compounds that have a cyclic structure and that contain within the molecule a double bond in which phosphorus and nitrogen are the participating elements.

When the phosphorus-containing compound (E) is incorporated in the resin composition according to the present embodiment, its content is preferably approximately 10 to 40 mass parts and preferably approximately 15 to 30 mass parts, in each case for each 100 mass parts of the total amount of the polyarylene ether copolymer (A) and triphenylmethane-type epoxy resin (B) (also including the epoxy resin (D) when the at least difunctional epoxy resin (D) is also incorporated). The content of the phosphorus-containing compound (E) is preferably an amount that provides a phosphorus atom content of 0.5 to 3 mass % with respect to the resin composition. It is thought that the flame retardancy can be raised even further by incorporating the phosphorus-containing compound (E) in the indicated content range.

The resin composition may contain—within a range in which the desired properties that form the objects of the present invention are not impaired—components in addition to the components that have already been described (the polyarylene ether copolymer (A), triphenylmethane-type epoxy resin (B), cure accelerator (C), at least difunctional epoxy resin (D), and phosphorus-containing compound (E)). As specific examples, the components described in the following may be incorporated.

First, the resin composition may contain an aromatic amine compound (F) that has a solubility in toluene at 25° C. of at least 10 mass %. This aromatic amine compound (F) can function as a curing agent for the triphenylmethane-type epoxy resin (B) and the at least difunctional epoxy resin (D). A resin composition that has even better dielectric properties and that provides an even better heat resistance for its cured product is obtained by the further addition of this aromatic amine compound (F) to the resin composition. The reason for this is thought to be as follows: because it is highly compatible with the polyarylene ether copolymer (A), this aromatic amine compound can accelerate the curing reaction of the epoxy resin without impeding the curing reaction between the polyarylene ether copolymer (A) and the triphenylmethane-type epoxy resin (B) and the at least difunctional epoxy resin (D). The resin composition undergoes three dimensional crosslinking as a result and a high solder heat resistance is then obtained.

When the aromatic amine compound (F) is incorporated in the resin composition according to the present embodiment, its content is preferably approximately 0.5 to 3 mass parts for each 100 mass parts of the total amount of the polyarylene ether copolymer (A) and triphenylmethane-type epoxy resin (B) (also including the epoxy resin (D) when the at least difunctional epoxy resin (D) is also incorporated). When the content is in this range, the dielectric properties are excellent and the Tg is high, and, in addition, it is thought that phase separation between (A) and (B) during curing can be inhibited to the greatest extent possible.

The resin composition may also contain a defoamer (G). The defoamer (G) used in the present embodiment should have a defoaming performance capable of inhibiting foaming by the resin composition, but is not otherwise particularly limited. That is, it should be able to inhibit the foaming that can be produced in the resin composition in association with prepreg production, e.g., when the resin composition is impregnated into fibrous structure, when this resin composition is cured, and so forth, but is not otherwise particularly limited. Specific examples here are silicone-type defoamers and organic defoamers. A single defoamer may be used by itself or a combination of two or more may be used. The silicone-type defoamer can be exemplified by polymethylalkylsiloxane-type defoamers and defoaming silicone polymer-type defoamers. The organic defoamer can be exemplified by isoparaffinic defoamers and acrylic defoamers.

The defoamer (G) may, in addition to having a defoaming action that is capable of inhibiting foaming by the resin composition, also have a leveling action. It is thought that the presence of this leveling action can provide an even better inhibition of the appearance of defects in the external appearance of the prepreg because smoothing of the surface is facilitated, for example, after the foam produced during prepreg production has been disrupted.

The content of this defoamer (G) will also vary as a function of, for example, the type of defoamer (G) and thus is not particularly limited. In specific terms, it is preferably, for example, 0.1 to 3 mass % and is more preferably 0.3 to 2.5 mass %, in each case with reference to the resin composition. When the content of the defoamer (G) is in this range, the appearance of defects in the external appearance of the prepreg can be thoroughly suppressed while also suppressing the appearance of problems such as a reduction in the dielectric properties and the heat resistance of the cured product.

The resin composition according to this embodiment may also contain a leveling agent. This leveling agent should be able to impart a leveling action to the resin composition, but is not otherwise particularly limited. It can be specifically exemplified by polyether-modified polydimethylsiloxane-type leveling agents, polyester-modified polydimethylsiloxane-type leveling agents, and acrylic leveling agents. Polyether-modified polydimethylsiloxane-type leveling agents are preferred thereamong. It is thought that the incorporation of this leveling agent can provide an even better inhibition of the appearance of defects in the external appearance of the prepreg because smoothing of the surface is facilitated, for example, after the foam produced during prepreg production has been disrupted.

The content of the leveling agent will also vary as a function of, for example, the type of leveling agent and thus is not particularly limited. In specific terms, it is preferably, for example, 0.1 to 3 mass % and more preferably is 0.3 to 2.5 mass %, in each case with reference to the resin composition. When the leveling agent content is in this range, the appearance of defects in the external appearance of the prepreg can be thoroughly suppressed while also suppressing the appearance of problems such as a reduction in the dielectric properties and the heat resistance of the cured product.

The epoxy equivalents/curing agent equivalents in the resin composition according to the present embodiment is preferably approximately 0.5 to 2. The curing agent referenced here encompasses all species that react with epoxy, and thus the polyarylene ether copolymer (A) and the aromatic amine compound (F) are also regarded as curing agents. The epoxy equivalents/curing agent equivalents is the value calculated using the formula epoxy mass/epoxy equivalent weight÷curing agent mass/curing agent equivalent weight. It is thought that the properties of the resin composition are further improved when the epoxy equivalents/curing agent equivalents is in the indicated range.

The resin composition may as necessary also incorporate, within a range in which the effects of the present invention are not impaired, an additive or additives, for example, an inorganic filler (for example, silica, alumina, talc, aluminum hydroxide, magnesium hydroxide, titanium oxide, mica, aluminum borate, barium sulfate, calcium carbonate, and so forth), heat stabilizer, static inhibitor, ultraviolet absorber, dye, pigment, lubricant, and so forth.

During prepreg production, the resin composition is frequently used made into a varnish for the purpose of impregnating the substrate (fibrous substrate) used for prepreg formation. That is, the resin composition is commonly often converted into a varnish (resin varnish). This resin varnish may be prepared, for example, as follows.

The various components capable of dissolution in organic solvent, i.e., the polyarylene ether copolymer (A), triphenylmethane-type epoxy resin (B), at least difunctional epoxy resin (D), and so forth, are first added to and dissolved in an organic solvent. Heat may be applied at this time as necessary. Those organic solvent-insoluble components that are used on an optional basis, for example, the inorganic filler, are subsequently added and a resin composition varnish is prepared by carrying out dispersion, to a specified state of dispersion, using, for example, a ball mill, bead mill, planetary mixer, or roll mill. The organic solvent should be capable of dissolving the polyarylene ether copolymer (A), triphenylmethane-type epoxy resin (B), at least difunctional epoxy resin (D), and so forth, and should not interfere with the curing reactions, but is not otherwise particularly limited. It can be specifically exemplified by toluene, cyclohexanone, and propylene glycol monomethyl ether acetate.

The method for producing a prepreg using the obtained resin varnish can be exemplified by methods in which a fibrous substrate is impregnated with this resin varnish followed by drying.

The fibrous substrate can be specifically exemplified by glass cloth, aramid cloth, polyester cloth, glass nonwoven fabric, aramid nonwoven fabric, polyester nonwoven fabric, pulp paper, linter paper, and so forth. A laminate with an excellent mechanical strength is obtained when glass cloth is used, and glass cloth that has been subjected to a flattening treatment process is particularly preferred. This flattening treatment process can be specifically exemplified by the continuous compression of the glass cloth using a press roll at a suitable pressure in order to compress the yarn flat. For example, a thickness of 0.04 to 0.3 mm can generally be used for the thickness of the fibrous substrate.

The impregnation is carried out, for example, by immersion (dipping) or coating. This impregnation may also be performed a plurality of times as necessary. In addition, impregnation may be repeated using a plurality of resin varnishes having different compositions and/or concentrations in order to adjust to the desired final composition and amount of resin.

The prepreg in a semi-cured state (B-stage) is obtained by heating the resin varnish-impregnated fibrous substrate under desired heating conditions, for example, 1 to 10 minutes at 80 to 170° C.

The prepreg according to this embodiment and obtained as described above has a superior external appearance and is free of abnormalities such as foaming.

A metal-clad laminate is produced using the obtained prepreg by a method in which a metal foil, e.g., copper foil, is stacked on one side or on both the upper and lower sides of either a single prepreg or a plurality of stacked prepregs and this assembly is molded by the application of heat and pressure thereto in order to convert it into a single laminated article, thereby yielding a laminate clad with metal foil on both sides or clad with metal foil on a single side. The conditions for the application of heat and pressure can be set as appropriate as a function of the thickness of the laminate being produced, the type of resin composition for the prepreg, and so forth, but can be exemplified by a temperature of 170 to 210° C., a pressure of 3.5 to 4.0 Pa, and a time of 60 to 150 minutes.

The resin composition exhibits an excellent heat resistance for its cured product and excellent dielectric properties, provides a low viscosity when made into a varnish, and exhibits a high flame retardancy without containing halogen. Due to this, a metal-clad laminate that uses a prepreg obtained using this resin composition is highly reliable and can produce a printed wiring board that has excellent dielectric properties, an excellent heat resistance, and an excellent flame retardancy and can do so while suppressing the appearance of molding defects.

In addition, by carrying out circuit formation by, for example, etching the metal foil on the surface of the fabricated laminate, a printed wiring board can be obtained in which a conductive circuit pattern is disposed on the surface of the laminate. The thusly obtained printed wiring board is a printed wiring board that exhibits excellent dielectric properties, an excellent heat resistance, and an excellent flame retardancy as well as a high Tg.

When the resin composition contains the epoxy resin (D), a metal-clad laminate that uses a prepreg obtained from such a resin composition, in addition to having the properties listed above, also has an excellent external appearance. Moreover, a printed wiring board obtained using such a metal-clad laminate, in addition to having the properties listed above, also has a superior external appearance.

This Description discloses art according to various aspects as described above, and the main art therewithin is summarized in the following.

An aspect of the present invention is a resin composition comprising (A) a polyarylene ether copolymer that has an intrinsic viscosity, measured in methylene chloride at 25° C., of 0.03 to 0.12 dL/g and that has an average of 1.5 to 3 phenolic hydroxyl groups in molecular terminal position per molecule, (B) a triphenylmethane-type epoxy resin that has a softening point of 50 to 70° C., and (C) a cure accelerator, wherein the content of the polyarylene ether copolymer (A) is 60 to 85 mass parts where the total of the polyarylene ether copolymer (A) and the epoxy resin (B) is 100 mass parts.

The use of this construction can provide a resin composition that yields a highly heat-resistant cured product, that has excellent dielectric properties, that provides a low viscosity when made into a varnish, and that has a high Tg and a high flame retardancy without containing halogen.

This resin composition also preferably contains (D) an at least difunctional epoxy resin that is a liquid at 30° C., wherein the content of the polyarylene ether copolymer (A) is 60 to 85 mass parts where the total of the polyarylene ether copolymer (A), the triphenylmethane-type epoxy resin (B), and the at least difunctional epoxy resin (D) is 100 mass parts.

The use of this construction can additionally provide a resin composition that provides an excellent external appearance when made into a prepreg.

In addition, the polyarylene ether copolymer (A) in this resin composition preferably consists of 2,6-dimethylphenol and a difunctional phenol. A resin composition having excellent dielectric properties and an excellent heat resistance as the cured product can be reliably obtained by using a polyarylene ether copolymer with such a structure.

The cure accelerator (C) in this resin composition is preferably at least one selected from imidazole compounds and the metal salts of fatty acids. Because of this, a resin composition having excellent dielectric properties and an excellent heat resistance as the cured product can be reliably obtained.

The resin composition preferably also contains (E) a phosphorus-containing compound. It is thought that the compatibility within the resin composition is improved because of this. This phosphorus-containing compound (E) is more preferably a cyclic phosphazene compound. It is thought that lowering of the Tg of the resin composition can be suppressed and the reliability can also be improved by incorporating such a phosphorus-containing compound (E).

The resin composition also preferably contains (F) an aromatic amine compound that has a solubility in toluene at 25° C. of at least 10 mass %. Because of this, a resin composition having excellent dielectric properties and an excellent heat resistance as the cured product can be reliably obtained.

The number-average molecular weight of the polyarylene ether copolymer (A) in this resin composition is preferably 500 to 3,000. By the application of such a construction, an excellent heat resistance is obtained for the cured product from the resin composition and the melt viscosity of the resin composition is not too high and a satisfactory fluidity can then be obtained.

The resin composition preferably also contains (G) a defoamer that is at least one selected from the group consisting of silicone-type defoamers and organic defoamers. The application of this construction yields a resin composition that can provide a thorough suppression of the occurrence of defects in the external appearance when the prepreg is fabricated.

The silicone-type defoamer in the resin composition is preferably at least one selected from the group consisting of polymethylalkylsiloxane-type defoamers and defoaming silicone polymer-type defoamers. The organic defoamer is preferably at least one selected from the group consisting of isoparaffinic defoamers and acrylic defoamers.

The application of such a construction can more effectively inhibit the occurrence of defects in the external appearance when the prepreg is fabricated.

The content of the defoamer (G) in the resin composition is preferably 0.1 to 3 mass %.

The resin composition preferably also contains a leveling agent. When such a construction is used, excellent dielectric properties and an excellent heat resistance are obtained and the occurrence of external appearance defects during use for prepreg fabrication can be more effectively inhibited.

The leveling agent is preferably a polyether-modified polydimethylsiloxane-type leveling agent, and/or the leveling agent content is preferably 0.1 to 3 mass %. The effects from the incorporation of the leveling agent are more reliability obtained when such a construction is used.

The resin varnish according to another aspect of the present invention comprises the resin composition under consideration and a solvent. The solvent in the resin varnish is preferably at least one selected from the group consisting of toluene, cyclohexanone, and propylene glycol monomethyl ether acetate. The use of such a construction yields a resin varnish that has excellent dielectric properties, an excellent heat resistance as the cured product, a low viscosity, and a high fluidity.

The prepreg according to another aspect of the present invention is obtained by impregnating the resin varnish into a fibrous substrate. Such a prepreg makes possible the fabrication of an electronic component, e.g., a printed wiring board, while suppressing the occurrence of molding defects.

The metal-clad laminate according to another aspect of the present invention is obtained by stacking a metal foil with the prepreg and molding with the application of heat and pressure. A metal-clad laminate having such a construction has a high reliability and makes possible the production of a printed wiring board that has excellent dielectric properties, an excellent heat resistance, and an excellent flame retardancy and does this while suppressing the occurrence of molding defects.

The printed wiring board according to another aspect of the present invention is produced using the prepreg described above or the metal-clad laminate described above. The thusly obtained printed wiring board is a printed wiring board that has excellent dielectric properties, an excellent heat resistance, and an excellent flame retardancy and that also has a high Tg.

The present invention is more particularly described using the following examples, but the scope of the present invention is not limited by or to these.

EXAMPLES

[Production of Resin Compositions]

Each of the components used to produce the resin composition is described in these examples. In these examples, the intrinsic viscosity measured in methylene chloride at 25° C. is indicated as the intrinsic viscosity (IV), while the solubility in toluene at 25° C. is indicated as the toluene solubility.

(The polyarylene ether copolymers: PAE)

SA-90: polyarylene ether copolymer (from SABIC Innovative Plastics, intrinsic viscosity (IV)=0.085 dL/g, number of terminal hydroxyl groups=1.9, number-average molecular weight Mn=1,050, equivalent weight=580)

PAE 2: polyarylene ether copolymer synthesized by the method described in WO 2007/067669 (intrinsic viscosity (IV)=0.06 dL/g, number of terminal hydroxyl groups=1.8, number-average molecular weight Mn=800, equivalent weight=420)

(The Epoxy Resins)

triphenylmethane-type epoxy resin 1: triphenylmethane-type epoxy resin (EPPN501H from Nippon Kayaku Co., Ltd., softening point=53° C., equivalent weight=166)

triphenylmethane-type epoxy resin 2: triphenylmethane-type epoxy resin (EPPN501HY from Nippon Kayaku Co., Ltd., softening point=59° C., equivalent weight=170)

triphenylmethane-type epoxy resin 3: triphenylmethane-type epoxy resin (EPPN502H from Nippon Kayaku Co., Ltd., softening point=65° C., equivalent weight=170)

triphenylmethane-type epoxy resin 4: triphenylmethane-type epoxy resin (EPPN503 from Nippon Kayaku Co., Ltd., softening point=88° C., equivalent weight=183)

at least difunctional liquid epoxy resin 1: bisphenol A-type epoxy resin (EPICLON N-850S from DIC Corporation, equivalent weight=190)

at least difunctional liquid epoxy resin 2: bisphenol F-type epoxy resin (EPICLON N-830S from DIC Corporation, equivalent weight=175)

other epoxy resin: cresol novolac-type epoxy resin (EPICLON N680 from DIC Corporation, softening point=80° C., equivalent weight=190)

(The Cure Accelerators)

imidazole compound: 2-ethyl-4-methylimidazole (2E4MZ from Shikoku Chemicals Corporation)

fatty acid metal salt (metal soap): zinc octanoate (from DIC Corporation)

(The Phosphorus-containing Compound) phosphorus-containing compound 1: cyclic phosphazene compound (SPB-100 from Otsuka Chemical Co., Ltd.)

(The Defoamers)

defoamer 1: isoparaffinic defoamer (BYK-054 from BYK Japan Kabushiki Kaisha)

defoamer 2: polymethylalkylsiloxane-type defoamer (BYK-077 from BYK Japan Kabushiki Kaisha)

defoamer 3: fluorine-modified polysiloxane-type defoamer (BYK-065 from BYK Japan Kabushiki Kaisha)

(The Leveling Agent)

leveling agent: polyether-modified polydimethylsiloxane-type leveling agent (BYK-330 from BYK Japan Kabushiki Kaisha)

(Other Component)

aromatic amine compound: diethyltoluenediamine (Ethacure 100 from Albemarle Japan Corporation, toluene solubility=100 mass %, equivalent weight=46)

Test Example 1

[Production Method]

A 50 mass % toluene solution of the polyarylene ether copolymer was first obtained by mixing the polyarylene ether copolymer with toluene and dissolving the polyarylene ether copolymer in the toluene by heating this mixture to 80° C. The epoxy resin was then added to this toluene solution of the polyarylene ether copolymer so as to provide the blending proportions given in Table 1, followed by stifling for 30 minutes to effect complete dissolution. The other components, e.g., the imidazole compound, phosphorus-containing compound, and so forth, were also added so as to provide the blending proportions given in Table 1, and a resin composition varnish (resin varnish) was obtained by carrying out dispersion with a ball mill.

The obtained resin varnish was then impregnated into a glass cloth (#7628 type from Nitto Boseki Co., Ltd., NTB, E-glass) followed by heating and drying for approximately 3 to 8 minutes at 160° C. to yield a prepreg. The resin content of the obtained prepreg (content of the resin composition in the prepreg) was approximately 42%.

Four plies of the obtained prepreg were stacked and this was heated and pressed at a temperature of 180° C. for 1 hour at a pressure of 30 kg/cm² to obtain an evaluation substrate having a thickness of approximately 0.8 mm.

The individual prepregs and evaluation substrates of Examples 1 to 9 and Comparative Examples 1 to 4 fabricated as described above were evaluated using the following methods.

[Dielectric Properties (Dielectric Constant and Dissipation Factor)]

The dielectric constant and dissipation factor of the evaluation substrate at 1 GHz were measured by the method according to IPC-TM650-2.5.5.9. Specifically, the dielectric constant and dissipation factor of the evaluation substrate at 1 GHz were measured using an impedance analyzer (RF Impedance Analyzer HP4291B from Agilent Technologies).

[Solder Heat Resistance]

The solder heat resistance was measured by the method according to JIS C 6481. Specifically, a pressure cooker test (PCT) was run at 121° C. and 2 atmospheres (0.2 MPa) for 2 hours on each sample of the evaluation substrate; immersion for 20 seconds in a 260° C. solder bath was performed for 5 samples; and the presence/absence of, e.g., measling, blistering, and so forth, was checked visually. An evaluation of "no abnormality" was made when the occurrence of, e.g., measling, blistering, and so forth, could not be seen, while an evaluation of "abnormality present" was made when such an occurrence could be seen. The same evaluation was carried out separately using a 288° C. solder bath in place of the 260° C. solder bath.

[Glass-transition Temperature (Tg)]

This was measured by the DSC measurement method based on IPC-TM-650-2.4.25 using a temperature ramp-up speed of 20° C./minute.

[Flame Retardancy]

A test piece with a length of 125 mm and a width of 12.5 mm was cut from the evaluation substrate. This test piece was evaluated in accordance with the "Test for Flammability of Plastic Materials-UL 94" from Underwriters Laboratories.

Specifically, the test piece was fixed at one end and held horizontally and the flame from a gas burner was brought into direct contact for 30 seconds with the free end. The burning rate was measured when the sample continued to burn after the removal of the flame. An evaluation corresponding to "HB" was rendered when the burning rate did not exceed 76.2 mm per minute or when burning stopped before the flame reached a point 102 mm from the end of the sample.

In addition, using a test piece as described above, a burning test was carried out 10 times by bringing the lower end of a vertically hung test piece into direct contact with the flame from a gas burner for 10 seconds, and an evaluation corresponding to "V-0" was rendered when the average burning time (seconds) when 5 pieces were tested was not more than 50 seconds.

[Solubility]

After cooling to room temperature, the obtained resin varnish was held for 1 day and the transparency of the resin varnish was then visually checked. An evaluation of "good" was made when transparency was observed, while an evaluation of "poor" was made when turbidity was observed.

[Resin Fluidity for the Prepreg]

The resin fluidity for each prepreg was measured by the method specified in JIS C 6521.

The results of these tests are given in the following Table 1.

TABLE 1

| | material name | eq. | Example 1 blend | Example 2 blend | Example 3 blend | Example 4 blend | Example 5 blend | Example 6 blend | Example 7 blend | Example 8 blend | Comp. Example 1 blend | Comp. Example 2 blend | Comp. Example 3 blend | Comp. Example 4 blend | Comp. Example 5 blend |
|---|---|---|---|---|---|---|---|---|---|---|---|---|---|---|---|
| A | SA-90 (IV = 0.085 dL/g, 1.9 functional groups) | 580 | 65 | 85 | | 65 | 65 | 65 | 70 | 65 | 65 | 65 | 90 | 50 | 65 |
| | PAF-2 (IV = 0.06 dL/g, 1.8 functional groups) | 420 | | | 70 | | | | | | | | | | |
| B | EPPN501H (53° C. softening point) | 166 | 35 | 15 | 30 | | | | 30 | 35 | | | | | |
| | EPPN501HY (59° C. softening point) | 170 | | | | 35 | | | | | | | | 50 | |
| | EPPN502H (65° C. softening point) | 170 | | | | | 35 | 35 | | | | | | | |
| | EPPN503 (88° C. softening point) | 183 | | | | | | | | | | | 10 | | 35 |
| D | EPICLON-850S (bis A) | 190 | | | | | | | | | 35 | | | | |
| | EPICLON-N680 (cresol novolac, softening point 80° C.) | 190 | | | | | | | | | | 35 | | | |
| C | 2E4MZ (imidazole) | — | 0.3 | 0.3 | 0.3 | 0.3 | 0.3 | 0.3 | 0.3 | 0.3 | 0.3 | 0.3 | 0.3 | 0.3 | 0.3 |
| | Zn octanoate (metal soap) | — | | | | | | 1 | | | | | | | |
| E | SPB-100 (cyclic phosphazene) | — | | | | | | | 20 | | | | | | |
| F | Ethacure (aromatic amine) | 46 | | | | | | | | 1 | | | | | |
| | epoxy equivalents/curing agent equivalents | | 1.9 | 0.6 | 1.1 | 1.8 | 1.8 | 1.9 | 1.5 | 1.6 | 1.6 | 1.6 | 0.4 | 3.5 | 1.7 |

| items evaluated | | Example 1 properties | Example 2 properties | Example 3 properties | Example 4 properties | Example 5 properties | Example 6 properties | Example 7 properties | Example 8 properties | Comp. Example 1 properties | Comp. Example 2 properties | Comp. Example 3 properties | Comp. Example 4 properties | Comp. Example 5 properties |
|---|---|---|---|---|---|---|---|---|---|---|---|---|---|---|
| dielectric constant (1 GHz) IPC-TM650-2.5.5.9 | | 4.1 | 3.8 | 4.0 | 4.0 | 4.0 | 4.0 | 3.9 | 4.0 | 4.1 | 4.1 | 3.8 | 4.3 | 4.0 |
| dissipation factor (1 GHz) IPC-TM650-2.5.5.9 | | 0.009 | 0.006 | 0.009 | 0.009 | 0.009 | 0.009 | 0.008 | 0.009 | 0.009 | 0.009 | 0.006 | 0.011 | 0.009 |
| solder heat resistance JIS 6481 | 260° C. | no abnormality | no abnormality | no abnormality | no abnormality | no abnormality | no abnormality | no abnormality | no abnormality | no abnormality | no abnormality | no abnormality | no abnormality | no abnormality |
| | 288° C. | no abnormality | no abnormality | no abnormality | no abnormality | no abnormality | no abnormality | no abnormality | no abnormality | no abnormality | no abnormality | blistering | blistering | no abnormality |
| glass-transition temperature Tg (DSC) | | 185 | 180 | 180 | 190 | 195 | 190 | 170 | 190 | 155 | 165 | 165 | 185 | 200 |
| flame retardancy UL94 | | HB | HB | HB | HB | HB | HB | V-0 | HB | HB | HB | HB | HB | HB |
| IPC-TM650-2.4.25 | | good | good | good | good | good | good | good | good | good | good | good | good | good |
| solubility for the solution | | 20 | 10 | 15 | 15 | 15 | 20 | 20 | 20 | 20 | 20 | 3 | 25 | 8 |
| resin fluidity for the prepreg JIS C 6521 | | | | | | | | | | | | | | |

As shown in Table 1, the use of a resin composition containing (A) a polyarylene ether copolymer having an intrinsic viscosity (IV) of 0.03 to 0.12 dL/g and 1.5 to 3 terminal hydroxyl groups, (B) a triphenylmethane-type epoxy resin having a softening point of 50 to 70° C., and (C) a cure accelerator, wherein the content of the polyarylene ether copolymer (A) is 60 to 85 mass parts where the total of the polyarylene ether copolymer (A) and the epoxy resin (B) is 100 mass parts (Examples 1 to 8), provided—in comparison with cases (Comparative Examples 1 and 2) where a bisphenol A-type epoxy resin or a cresol novolac-type epoxy resin is used in place of the epoxy resin (B)—a superior solder heat resistance, a superior flame retardancy, a superior solubility, and a superior resin fluidity for the prepreg, and did so without causing a deterioration in the dielectric properties, e.g., the dielectric constant and the dissipation factor, and also provided a higher Tg and little increase in the viscosity of the resin varnish.

It was also shown that an even higher Tg was obtained in Examples 4 and 5, which incorporated an epoxy resin (B) having a softening point of at least 55° C.; in Example 6, which incorporated both an imidazole compound and a metal soap for the cure accelerator (C); and in Example 8, which additionally contained an aromatic amine (F). On the other hand, a very high flame retardancy was obtained in Example 7, which additionally incorporated a phosphorus-containing compound (E).

When the content of the polyarylene ether copolymer (A), expressed per 100 mass parts of the total of the polyarylene ether copolymer (A) and epoxy resin (B), was greater than 85 mass parts, the Tg, solder heat resistance, and resin fluidity for the prepreg were reduced (Comparative Example 3); when it was less than 65 mass parts, the dielectric constant and dissipation factor were increased and the solder heat resistance was reduced (Comparative Example 4). It was also shown that the resin fluidity for the prepreg worsened when an epoxy resin with a softening point above 70° C. was used for the epoxy resin (B) (Comparative Example 5).

Test Example 2

[Production Method]

Preparation of samples was carried out as in Test Example 1, with the exception that the resin composition varnish (resin varnish) was obtained by the addition of the epoxy resins at the blending proportions given in Table 2.

The obtained resin varnish was then impregnated into a glass cloth (#7628 type from Nitto Boseki Co., Ltd., NTB, E-glass) followed by heating and drying for approximately 3 to 8 minutes at 160° C. to yield a prepreg. The resin content of the obtained prepreg (content of the resin composition in the prepreg) was approximately 42%.

Four plies of the obtained prepreg were stacked and this was heated and pressed at a temperature of 180° C. for 1 hour at a pressure of 30 kg/cm$^2$ to obtain an evaluation substrate having a thickness of approximately 0.8 mm.

Using the previously described evaluation methods, the individual prepregs and evaluation substrates of Examples 9 to 17 and Comparative Examples 6 to 10 fabricated as described above were evaluated for their dielectric properties (dielectric constant and dissipation factor), solder heat resistance, glass-transition temperature (Tg), flame retardancy, solubility, and resin fluidity for the prepreg. In addition to these evaluations, the external appearance of the prepreg was evaluated as follows in Test Example 2.

[External Appearance of the Prepreg]

A 5 mm×5 mm test piece was cut from each of the evaluation substrates. The number of bubbles in each test piece was then measured using a microscope. An evaluation of "very good" was made when the number of bubbles was 5 or fewer; an evaluation of "good" was made when the number of bubbles was 6 to 24; and an evaluation of "poor" was made when the number of bubbles was 25 or more.

The results of these tests are given in the following Table 2.

TABLE 2

| | material name | eq. | Example 9 blend | Example 10 blend | Example 11 blend | Example 12 blend | Example 13 blend | Example 14 blend | Example 15 blend | Example 16 blend | Example 17 blend | Comp. Example 6 blend | Comp. Example 7 blend | Comp. Example 8 blend | Comp. Example 9 blend | Comp. Example 10 blend |
|---|---|---|---|---|---|---|---|---|---|---|---|---|---|---|---|---|
| A | SA-90 (IV = 0.085 dL/g, 1.9 functional groups) | 580 | 65 | 65 | | 65 | 65 | 65 | 65 | 65 | 65 | 65 | 65 | 65 | 90 | 50 |
| | PAE-2 (IV = 0.06 dL/g, 1.8 functional groups) | 420 | | | 70 | | | | | | | | | | | |
| B | EPPN501H (53° C. softening point) | 166 | 15 | | 15 | 15 | | | | 15 | 15 | | | | 5 | 25 |
| | EPPN501HY (59° C. softening point) | 170 | | 25 | | | 15 | | 15 | | | | | | | |
| | EPPN502H (65° C. softening point) | 170 | | | | | | 15 | | | | | | | | |
| | EPPN503 (88° C. softening point) | 183 | | | | | | | | | | | | 15 | | |
| D | EPICLON-850S (bis A) | 190 | 20 | 10 | 15 | | 20 | 20 | 20 | 20 | 20 | | | 20 | 5 | 25 |
| | EPICLON-830S (bis F) | 175 | | | | 20 | | | | | | 35 | | | | |
| | EPICLON-N680 (cresol novolac, softening point 80° C.) | 190 | | | | | | | | | | | 35 | | | |
| C | 2E4MZ (imidazole) | — | 0.3 | 0.3 | 0.3 | 0.3 | 0.3 | 0.3 | 0.3 | 0.3 | 0.3 | 0.3 | 0.3 | 0.3 | 0.3 | 0.3 |
| | Zn octanoate (metal soap) | — | | | | | | | 1 | | | | | | | |
| E | SPB-100 (cyclic phosphazene) | — | | | | | | | | 1 | 20 | | | | | |
| F | Ethacure (aromatic amine) | 46 | | | | | | | | | | | | | | |
| | epoxy equivalents/curing agent equivalents | | 1.7 | 1.8 | 1.0 | 1.8 | 1.7 | 1.7 | 1.7 | 1.5 | 1.7 | 1.6 | 1.6 | 1.7 | 0.4 | 3.3 |

| items | | Example 9 properties | Example 10 properties | Example 11 properties | Example 12 properties | Example 13 properties | Example 14 properties | Example 15 properties | Example 16 properties | Example 17 properties | Comp. Example 6 properties | Comp. Example 7 properties | Comp. Example 8 properties | Comp. Example 9 properties | Comp. Example 10 properties |
|---|---|---|---|---|---|---|---|---|---|---|---|---|---|---|---|
| dielectric constant (1 GHz) IPC-TM650-2.5.5.9 | | 4.1 | 4.1 | 4.0 | 4.1 | 4.1 | 4.1 | 4.1 | 4.1 | 3.9 | 4.1 | 4.1 | 4.1 | 3.9 | 4.3 |
| dissipation factor (1 GHz) IPC-TM650-2.5.5.9 | | 0.009 | 0.009 | 0.008 | 0.009 | 0.009 | 0.009 | 0.009 | 0.009 | 0.007 | 0.009 | 0.009 | 0.009 | 0.007 | 0.013 |
| solder heat resistance JIS 6481 | 260° C. | no abnormality | no abnormality | no abnormality | no abnormality | no abnormality | no abnormality | no abnormality | no abnormality | no abnormality | no abnormality | no abnormality | no abnormality | no abnormality | no abnormality |
| | 288° C. | no abnormality | no abnormality | no abnormality | no abnormality | no abnormality | no abnormality | no abnormality | no abnormality | no abnormality | no abnormality | no abnormality | no abnormality | no abnormality | no abnormality |

TABLE 2-continued

| glass-transition temperature Tg (DSC) | 180 | 185 | 180 | 180 | 185 | 190 | 185 | 185 | 170 | 155 | 165 | 190 | 175 | 175 |
|---|---|---|---|---|---|---|---|---|---|---|---|---|---|---|
| flame retardancy UL94 | HB | HB | HB | HB | HB | HB | HB | HB | V-0 | HB | HB | HB | HB | HB |
| solubility for the solution | good | good | good | good | good | good | good | good | good | good | good | good | good | good |
| external appearance of the prepreg | very good | good | good | very good | very good | good | very good | very good | very good | good | poor | poor | poor | very good |
| resin fluidity for the prepreg JIS C 6521 | 20 | 15 | 15 | 20 | 15 | 15 | 20 | 20 | 20 | 20 | 20 | 10 | 10 | 10 |

As shown in Table 2, the use of a resin composition according to the present embodiment (Examples 9 to 17) provided an excellent solder heat resistance, an excellent flame retardancy, an excellent solubility, and an excellent resin fluidity for the prepreg, and did so without causing a deterioration in the dielectric properties, e.g., the dielectric constant and the dissipation factor, and also provided a high Tg, an excellent external appearance for the prepreg, and little increase in the viscosity of the resin varnish.

It was also shown that an even higher Tg was obtained in Examples 13 and 14, which incorporated an epoxy resin (B) having a softening point of at least 55° C.; in Example 15, which incorporated both an imidazole compound and a metal soap for the cure accelerator (C); and in Example 16, which additionally contained an aromatic amine (F). On the other hand, a very high flame retardancy was obtained in Example 17, which additionally incorporated a phosphorus-containing compound (E).

It is also shown that the Tg is reduced when (B) the triphenylmethane-type epoxy resin having a softening point of 50 to 70° C. is not incorporated (Comparative Examples 6 and 7), in comparison to the use of a resin composition according to the present embodiment (Examples 9 to 17). In addition, the external appearance of the prepreg was poor and bubbles remained present in Comparative Example 7, which used a cresol novolac-type epoxy resin with a melting point of 80° C. in place of the (D) at least difunctional epoxy resin that is a liquid at 30° C.

Moreover, when a triphenylmethane-type epoxy resin (B) having a softening point in excess of 70° C. was used, the Tg was raised, but there were substantial problems with the external appearance (Comparative Example 8). In addition, when the content of the polyarylene ether copolymer (A), expressed per 100 mass parts of the total of the polyarylene ether copolymer (A) and epoxy resin (B), was greater than 85 mass parts, the external appearance of the prepreg and the resin fluidity for the prepreg were poor (Comparative Example 9); when it was less than 65 mass parts, the dielectric constant and dissipation factor were increased (Comparative Example 10).

Test Example 3

[Production Method]

Resin compositions were investigated that incorporated the defoamer (G) and/or a leveling agent in addition to the constituent components (A) to (C) according to the present embodiment. Preparation of samples was carried out as in Test Example 1, with the exception that the resin composition varnish (resin varnish) was obtained by the addition of the epoxy resins at the blending proportions given in Table 3.

The obtained resin varnish was then impregnated into a glass cloth (#7628 type from Nitto Boseki Co., Ltd., NTB, E-glass) followed by heating and drying for approximately 3 to 8 minutes at 160° C. to yield a prepreg. The resin content of the obtained prepreg (content of the resin composition in the prepreg) was approximately 42%.

Four plies of the resulting prepreg were stacked and this was heated and pressed at a temperature of 180° C. for 1 hour at a pressure of 30 kg/cm$^2$ to obtain an evaluation substrate having a thickness of approximately 0.8 mm.

Using the previously described evaluation methods, the individual prepregs and evaluation substrates of Examples 18 to 30 fabricated as described above were evaluated for their dielectric properties (dielectric constant and dissipation factor), solder heat resistance, glass-transition temperature (Tg), flame retardancy, solubility, and resin fluidity for the prepreg. The external appearance of the prepreg was also evaluated as in Test Example 2. In addition to these evaluations, foaming by the varnish, dust detachment from the prepreg, and the surface gloss of the prepreg were also evaluated as follows in Test Example 3.

[Foaming]

The obtained resin varnish was stirred for 10 minutes at 3000 rpm and was then held at quiescence for 10 minutes. The resin varnish was visually checked after this holding period. An evaluation of "good" was made when bubbles could not be seen in the resin varnish, while an evaluation of "poor" was made when bubbles could be identified in the resin varnish.

[Dust Detachment from the Prepreg]

During prepreg production by the impregnation of a resin varnish into a fibrous substrate, for example, the resin may assume an overcoated state on the fibrous substrate without the air bubbles escaping from the voids in the fibrous substrate, and this can cause a resin dust to detach when the prepreg is cut. That is, dust detachment may occur. An evaluation of "good" was made when this dust detachment was not observed to occur when the obtained prepreg was cut, while an evaluation of "poor" was made when dust detachment was observed to occur.

[Prepreg Surface Gloss]

The obtained prepreg was visually evaluated. An evaluation of "good" was made when the surface of the prepreg assumed a uniform and very smooth state, for example, when the surface of the prepreg was very smooth even after foaming. An evaluation of "poor" was made for a state in which the smoothness was more-or-less reduced due to foaming. A state in which the smoothness has been more-or-less reduced due to foaming is a state that facilitates dust detachment when the surface of the prepreg is rubbed, for example, during packaging.

The results of these evaluations are given in the following Table 3.

TABLE 3

| | material name | eq. | manufacturer | Example 18 blend | Example 19 blend | Example 20 blend | Example 21 blend | Example 22 blend | Example 23 blend | Example 24 blend | Example 25 blend | Example 26 blend | Example 27 blend | Example 28 blend | Example 29 blend | Example 30 blend |
|---|---|---|---|---|---|---|---|---|---|---|---|---|---|---|---|---|
| A | SA-90 (IV = 0.085 dL/g, 1.9 functional groups) | 750 | SABIC Innovative Plastics | 65 | 65 | 65 | 65 | 65 | 65 | 65 | 65 | 65 | 65 | 65 | 65 | 65 |
| | PAF-2 (IV = 0.06 dL/g, 1.8 functional groups) | 420 | produced in-house according to WO 2007/-067669 | | | | | | | | | | | | | |
| B | EPPN501H (softening point 53° C.) | 166 | Nippon Kayaku Co., Ltd. | 35 | 35 | | | | | | | | | | | |
| | EPPN501HY (softening point 59° C.) | 170 | Nippon Kayaku Co., Ltd. | | | 35 | 35 | 35 | 35 | 35 | 35 | 35 | 35 | 35 | 35 | 35 |
| | EPPN502H (softening point 65° C.) | 170 | Nippon Kayaku Co., Ltd. | | | | | | | | | | | | | |
| D | EPICLON-850S (bis A) | 190 | DIC Corporation | | | | | | | | | | | | | |
| | EPICLON-N680 (cresol novolac, softening point 80° C.) | 190 | DIC Corporation | | | | | | | | | | | | | |
| F | Ethacure (aromatic amine) | 46 | Albemarle Japan Corporation | 0.3 | 0.3 | 0.3 | 0.3 | 0.3 | 0.3 | 0.3 | 0.3 | 0.3 | 0.3 | 0.3 | 0.3 | 0.3 |
| C | 2E4MZ (imidazole) | — | Shikoku Chemicals Corporation | | 0.1 | 1 | 3 | — | 1 | 3 | — | — | — | — | — | — |
| | Zn octanoate (metal soap) | — | DIC Corporation | | | | | 0.1 | | | 0.1 | 0.1 | 0.1 | 0.1 | — | — |
| E | SPB-100 (cyclic phosphazene) | — | Otsuka Chemical Industry Co., Ltd. | | | | | | | | | | | | | |
| G | defoamer 1 BYK-054 | | BYK Japan KK | | | | | | | | | 1 | 3 | — | — | — |
| | defoamer 2 BYK-077 | | BYK Japan KK | | | | | | | | | | | | 1 | 3 |
| | defoamer 3 BYK-065 | | BYK Japan KK | | | | | | | | 0.1 | | | | | |
| | leveling agent BYK-330 | | BYK Japan KK | | | | | | | | | | | | | |
| | epoxy equivalents/curing agent equivalents | | | 2.4 | 2.4 | 2.4 | 2.4 | 2.4 | 2.4 | 2.4 | 2.4 | 2.4 | 2.4 | 2.4 | 2.4 | 2.4 |

TABLE 3-continued

| items evaluated | Example 18 | Example 19 | Example 20 | Example 21 | Example 22 | Example 23 | Example 24 | Example 25 | Example 26 | Example 27 | Example 28 | Example 29 | Example 30 |
|---|---|---|---|---|---|---|---|---|---|---|---|---|---|
| dielectric constant (1 GHz) IPC-TM650-2.5.5.9 | 4.1 | 4.1 | 4.1 | 4.1 | 4.1 | 4.1 | 4.1 | 4.1 | 4.1 | 4.1 | 4.1 | 4.1 | 4.1 |
| dissipation factor (1 GHz) IPC-TM650 2.5.5.9 | 0.009 | 0.009 | 0.009 | 0.009 | 0.009 | 0.009 | 0.009 | 0.009 | 0.009 | 0.009 | 0.009 | 0.009 | 0.009 |
| solder heat resistance JIS 6481 260° C. | no abnormality | no abnormality | no abnormality | no abnormality | no abnormality | no abnormality | no abnormality | no abnormality | no abnormality | no abnormality | no abnormality | no abnormality | no abnormality |
| 288° C. | no abnormality properties | no abnormality properties | no abnormality properties | no abnormality properties | no abnormality properties | no abnormality properties | no abnormality properties | no abnormality properties | no abnormality properties | no abnormality properties | no abnormality properties | no abnormality properties | no abnormality properties |
| glass-transition temperature Tg (DSC) IPC-TM650-2.4.25 | 185 | 185 | 180 | 180 | 185 | 180 | 180 | 185 | 183 | 180 | 185 | 180 | 180 |
| flame retardancy UL94 | HB | HB | HB | HB | HB | HB | HB | HB | HB | HB | HB | HB | HB |
| solubility for the solution (after cooling to room temperature and standing for 1 day: good = transparent, fair = semitransparent, poor = turbid) | good | good | good | good | good | good | good | good | good | good | good | good | good |
| resin fluidity for the prepreg JIS C 6521 | 20 | 20 | 20 | 20 | 20 | 20 | 20 | 20 | 20 | 20 | 20 | 20 | 20 |
| varnish foaming, evaluated by the same method as in Japanese Patent Application No. 2011-172091 | good | very good | very good | very good | very good | very good | very good | very good | very good | very good | poor | good | good |
| dust detachment from the prepreg, evaluated by the same method as in Japanese Patent Application No. 2011-172091 | poor | good | very good | very good | good | very good | very good | very good | very good | very good | poor | poor | poor |
| prepreg surface gloss, evaluated by the same method as in Japanese Patent Application No. 2011-172091 | poor | good | very good | very good | good | very good | very good | very good | very good | very good | poor | poor | poor |

As shown in Table 3, it was indicated that Examples 19 to 27, which incorporated a defoamer (G) and possibly a leveling agent, had a better varnish foaming rating, a better dust detachment from the prepreg, and a better surface gloss than did Example 18, which incorporated neither the defoamer (G) nor a leveling agent. In addition, when a defoamer was used and it was a fluorine-type defoamer such as a fluorine-modified polysiloxane-type defoamer (Examples 28 to 30), the resin varnish underwent foaming notwithstanding the incorporation of the defoamer and dust detachment and a reduced surface gloss were seen with the resulting prepreg, and it was thus shown that a silicone-type defoamer and an organic defoamer were preferred.

Test Example 4

[Production Method]

Resin compositions were investigated that incorporated the defoamer (G) and/or a leveling agent in addition to the constituent components (A) to (D) according to the present embodiment. Preparation of samples was carried out as in Test Example 2, with the exception that the resin composition varnish (resin varnish) was obtained by the addition of the epoxy resins at the blending proportions given in Table 4.

The obtained resin varnish was then impregnated into a glass cloth (#7628 type from Nitto Boseki Co., Ltd., NTB, E-glass) followed by heating and drying for approximately 3 to 8 minutes at 160° C. to yield a prepreg. The resin content of the obtained prepreg (content of the resin composition in the prepreg) was approximately 42%.

Four plies of the obtained prepreg were stacked and this was heated and pressed at a temperature of 180° C. for 1 hour at a pressure of 30 kg/cm$^2$ to obtain an evaluation substrate having a thickness of approximately 0.8 mm.

Using the previously described evaluation methods, the individual prepregs and evaluation substrates of Examples 31 to 43 fabricated as described above were evaluated for their dielectric properties (dielectric constant and dissipation factor), solder heat resistance, glass-transition temperature (Tg), flame retardancy, solubility, and resin fluidity for the prepreg. The external appearance of the prepreg was also evaluated as in Test Example 2, and varnish foaming, dust detachment from the prepreg, and prepreg surface gloss were also evaluated as in Test Example 3.

The results of these evaluations are given in the following Table 4.

TABLE 4

| | material name | eq. | manufacturer | Example 31 blend | Example 32 blend | Example 33 blend | Example 34 blend | Example 35 blend | Example 36 blend | Example 37 blend | Example 38 blend | Example 39 blend | Example 40 blend | Example 41 blend | Example 42 blend | Example 43 blend |
|---|---|---|---|---|---|---|---|---|---|---|---|---|---|---|---|---|
| A | SA-90 (IV = 0.085 dL/g, 1.9 functional groups) | 750 | SABIC Innovative Plastics | 65 | 65 | 65 | 65 | 65 | 65 | 65 | 65 | 65 | 65 | 65 | 65 | 65 |
| | PAE-2 (IV = 0.06 dL/g, 1.8 functional groups) | 420 | produced in-house according to WO 2007/-067669 | | | | | | | | | | | | | |
| D | EPICLON-850S (bis A) | 190 | DIC Corporation | 10 | 10 | 10 | 10 | 10 | 10 | 10 | 10 | 10 | 10 | 10 | 10 | 10 |
| | EPICLON-830S (bis F) | 175 | DIC Corporation | | | | | | | | | | | | | |
| | EPICLON-N680 (cresol novolac, softening point 80° C.) | 190 | DIC Corporation | | | | | | | | | | | | | |
| B | EPPN501H (softening point 53° C.) | 166 | Nippon Kayaku Co., Ltd. | 25 | 25 | 25 | 25 | 25 | 25 | 25 | 25 | 25 | 25 | 25 | 25 | 25 |
| | EPPN501HY (softening point 59° C.) | 170 | Nippon Kayaku Co., Ltd. | | | | | | | | | | | | | |
| | EPPN502H (softening point 65° C.) | 170 | Nippon Kayaku Co., Ltd. | | | | | | | | | | | | | |
| F | Ethacure (aromatic amine) | 46 | Albemarle Japan Corporation | | | | | | | | | | | | | |
| C | 2E4MZ (imidazole) | — | Shikoku Chemicals Corporation | 0.3 | 0.3 | 0.3 | 0.3 | 0.3 | 0.3 | 0.3 | 0.3 | 0.3 | 0.3 | 0.3 | 0.3 | 0.3 |
| | Zn octanoate (metal soap) | — | DIC Corporation | | | | | | | | | | | | | |
| E | SPB-100 (cyclic phosphazene) | — | Otsuka Chemical Industry Co., Ltd. | | | | | | | | | | | | | |
| G | defoamer 1 BYK-054 | | BYK Japan KK | — | 0.1 | 1 | 3 | — | — | — | — | — | — | — | — | — |
| | defoamer 2 BYK-077 | | BYK Japan KK | — | — | — | — | 0.1 | 1 | 3 | — | — | — | — | — | — |
| | defoamer 3 BYK-065 | | BYK Japan KK | — | — | — | — | — | — | — | 0.1 | — | 0.1 | — | 1 | 3 |
| | leveling agent BYK-330 | | BYK Japan KK | — | — | — | — | — | — | — | — | 1 | 3 | 0.1 | — | — |
| | epoxy equivalents/curing agent equivalents | | | 2.3 | 2.3 | 2.3 | 2.3 | 2.3 | 2.3 | 2.3 | 2.3 | 2.3 | 2.3 | 2.3 | 2.3 | 2.3 |

TABLE 4-continued

| items evaluated | Example 31 properties | Example 32 properties | Example 33 properties | Example 34 properties | Example 35 properties | Example 36 properties | Example 37 properties | Example 38 properties | Example 39 properties | Example 40 properties | Example 41 properties | Example 42 properties | Example 43 properties |
|---|---|---|---|---|---|---|---|---|---|---|---|---|---|
| dielectric constant (1 GHz) IPC-TM650-2.5.5.9 | 4.1 | 4.1 | 4.1 | 4.1 | 4.1 | 4.1 | 4.1 | 4.1 | 4.1 | 4.1 | 4.1 | 4.1 | 4.1 |
| dissipation factor (1 GHz) IPC-TM650 2.5.5.9 | 0.009 | 0.009 | 0.009 | 0.009 | 0.009 | 0.009 | 0.009 | 0.009 | 0.009 | 0.009 | 0.009 | 0.009 | 0.009 |
| solder heat resistance JIS 6481 260° C. | no abnormality | no abnormality | no abnormality | no abnormality | no abnormality | no abnormality | no abnormality | no abnormality | no abnormality | no abnormality | no abnormality | no abnormality | no abnormality |
| 288° C. | no abnormality | no abnormality | no abnormality | no abnormality | no abnormality | no abnormality | no abnormality | no abnormality | no abnormality | no abnormality | no abnormality | no abnormality | no abnormality |
| glass-transition temperature Tg (DSC) IPC-TM650-2.4.25 | 175 | 175 | 170 | 170 | 175 | 170 | 170 | 175 | 173 | 170 | 175 | 170 | 170 |
| flame retardancy UL94 | HB | HB | HB | HB | HB | HB | HB | HB | HB | HB | HB | HB | HB |
| solubility for the solution (after cooling to room temperature and standing for 1 day; good = transparent, fair = semitransparent, poor = turbid) | good | good | good | good | good | good | good | good | good | good | good | good | good |
| external appearance of the prepreg (no abnormality = good, abnormality (foaming, dust detachment) = poor) | good | very good | very good | very good | good | very good | very good | very good | very good | very good | good | good | good |
| resin fluidity for the prepreg JIS C 6521 | 15 | 15 | 15 | 15 | 15 | 15 | 15 | 15 | 15 | 15 | 15 | 15 | 15 |
| varnish foaming, evaluated by the same method as in Japanese Patent Application No. 2011-172091 | good | very good | very good | very good | good | very good | very good | very good | very good | very good | poor | good | good |
| dust detachment from the prepreg, evaluated by the same method as in Japanese Patent Application No. 2011-172091 | good | good | very good | very good | good | very good | very good | very good | very good | very good | poor | poor | poor |
| prepreg surface gloss, evaluated by the same method as in Japanese Patent Application No. 2011-172091 | good | good | very good | very good | good | very good | very good | very good | very good | very good | poor | poor | poor |

As shown in Table 4, it was also indicated, for resin compositions that contained the constituent components (A) to (D) according to the present embodiment, that Examples 32 to 40, which incorporated a defoamer (G) and possibly a leveling agent, had a better varnish foaming rating, a better dust detachment from the prepreg, and a better surface gloss than did Example 31, which incorporated neither the defoamer (G) nor a leveling agent. In addition, when a defoamer was used and it was a fluorine-type defoamer such as a fluorine-modified polysiloxane-type defoamer (Examples 41 to 43), the results were a somewhat poorer varnish foaming, dust detachment from the prepreg, and prepreg surface gloss, and it was thus shown that a silicone-type defoamer and an organic defoamer were preferred for the defoamer (G).

This application is based on Japanese Patent Application No. 2011-157837 and Japanese Patent Application No. 2011-157838, both filed on 19 Jul. 2011, and their contents are incorporated in the present application.

In order to describe the present invention, the present invention has been fully and appropriately described in the preceding through embodiments with reference to, e.g., examples, figures, and so forth; however, it should be recognized that these embodiments can be readily altered and/or improved by the individual skilled in the art. Accordingly, insofar as a modified form or improved form devised by the individual skilled in the art is not at a level that departs from the scope of rights described in the claims, such a modified form or improved form is construed to be encompassed by this scope of rights.

INDUSTRIAL APPLICABILITY

The present invention has a broad industrial and commercial applicability in the technical fields related to resin compositions, resin varnishes, prepregs, metal-clad laminates, and printed wiring boards.

The invention claimed is:

1. A resin composition comprising a polyarylene ether copolymer (A) that has an intrinsic viscosity, measured in methylene chloride at 25° C., of 0.03 to 0.12 dL/g and that has an average of 1.5 to 3 phenolic hydroxyl groups in molecular terminal position per molecule, a triphenylmethane-type epoxy resin (B) that has a softening point of 50 to 70° C., a cure accelerator (C) and an at least difunctional epoxy resin (D) that is a liquid at 30° C., wherein:
the content of the polyarylene ether copolymer (A) is 60 to 85 mass parts where the total of the polyarylene ether copolymer (A) and the triphenylmethane-type epoxy resin (B) is 100 mass parts, and
the content of the epoxy resin (D) is 7 to 23 mass parts where the total of the polyarylene ether copolymer (A), the triphenylmethane-type epoxy resin (B), and the at least difunctional epoxy resin (D) is 100 mass parts.

2. The resin composition according to claim 1, wherein the content of the polyarylene ether copolymer (A) is 60 to 85 mass parts where the total of the polyarylene ether copolymer (A), the triphenylmethane-type epoxy resin (B), and the at least difunctional epoxy resin (D) is 100 mass parts.

3. The resin composition according to claim 1, wherein the polyarylene ether copolymer (A) consists of 2,6-dimethylphenol and a difunctional phenol.

4. The resin composition according to claim 1, wherein the cure accelerator (C) is at least one selected from imidazole compounds and metal salts of fatty acids.

5. The resin composition according to claim 1, further comprising a phosphorus-containing compound (E).

6. The resin composition according to claim 5, wherein the phosphorus-containing compound (E) is a cyclic phosphazene compound.

7. The resin composition according to claim 1, further containing an aromatic amine compound (F) that has a solubility in toluene at 25° C. of at least 10 mass %.

8. The resin composition according to claim 1, wherein the number-average molecular weight of the polyarylene ether copolymer (A) is 500 to 3,000.

9. The resin composition according to claim 1, further containing a defoamer (G) that is at least one selected from the group consisting of silicone-type defoamers and organic defoamers.

10. The resin composition according to claim 9, wherein the silicone-type defoamer is at least one selected from the group consisting of polymethylalkylsiloxane-type defoamers and defoaming silicone polymer-type defoamers.

11. The resin composition according to claim 9, wherein the organic defoamer is at least one selected from the group consisting of isoparaffinic defoamers and acrylic defoamers.

12. The resin composition according to claim 9, wherein the content of the defoamer (G) is 0.1 to 3 mass %.

13. The resin composition according to claim 1, further containing a leveling agent.

14. The resin composition according to claim 13, wherein the leveling agent is a polyether-modified polydimethylsiloxane-type leveling agent.

15. The resin composition according to claim 13, wherein the content of the leveling agent is 0.1 to 3 mass %.

16. A resin varnish comprising a solvent and the resin composition according to claim 1.

17. The resin varnish according to claim 16, wherein the solvent is at least one selected from the group consisting of toluene, cyclohexanone, and propylene glycol monomethyl ether acetate.

18. A prepreg obtained by impregnating a fibrous substrate with a resin varnish according to claim 16.

19. A metal-clad laminate obtained by laminating a metal foil on the prepreg according to claim 18 and then molding with the application of heat and pressure.

20. A printed wiring board produced using the prepreg according to claim 18.

21. A printed wiring board produced using the metal-clad laminate according to claim 19.

* * * * *